United States Patent
Wittmann et al.

(10) Patent No.: US 7,141,925 B2
(45) Date of Patent: Nov. 28, 2006

(54) COMPONENT WITH MECHANICAL CONNECTOR, IN PARTICULAR A DISPLAY APPARATUS WITH ORGANIC LIGHT-EMITTING DIODES

(75) Inventors: Georg Wittmann, Herzogenaurach (DE); Jan Birnstock, Dresden (DE); Ralph Pätzold, Roth (DE); Karsten Heuser, Erlangen (DE); Debora Henseler, Erlangen (DE)

(73) Assignee: Osram OPTO Semiconductors GmbH, Rengensburg (DE)

( * ) Notice: Subject to any disclaimer, the term of this patent is extended or adjusted under 35 U.S.C. 154(b) by 281 days.

(21) Appl. No.: 10/815,577

(22) Filed: Mar. 31, 2004

(65) Prior Publication Data

US 2004/0217703 A1  Nov. 4, 2004

(30) Foreign Application Priority Data

Mar. 31, 2003 (DE) .................. 103 14 522
Jun. 30, 2003 (DE) .................. 103 29 366

(51) Int. Cl.
*H01J 1/62* (2006.01)
*H01J 63/04* (2006.01)

(52) U.S. Cl. .............. 313/506; 313/498; 313/504; 313/512

(58) Field of Classification Search ............ 313/498, 313/504, 506, 512
See application file for complete search history.

(56) References Cited

U.S. PATENT DOCUMENTS 4,810,931 A * 3/1989 McKenna et al. .......... 313/509
6,049,167 A * 4/2000 Onitsuka et al. ........... 313/512
6,080,031 A   6/2000 Rogers et al. ............... 445/25
6,210,815 B1  4/2001 Ooishi ...................... 428/690
6,262,531 B1 * 7/2001 Inoguchi et al. ........... 313/506
6,605,893 B1 * 8/2003 Ando ........................ 313/495
6,624,572 B1 * 9/2003 Kim et al. .................. 313/512
6,850,006 B1 * 2/2005 Kim et al. .................. 313/512
6,888,307 B1 * 5/2005 Silvernail et al. .......... 313/512
6,936,131 B1 * 8/2005 McCormick et al. ...... 156/292
2002/0068143 A1  6/2002 Silvernail et al. ........... 428/76
2003/0062829 A1  4/2003 Heimgärtner et al. ...... 313/506

FOREIGN PATENT DOCUMENTS

DE   100 05 296 A1   8/2001
WO   02/21557 A1     3/2002

* cited by examiner

*Primary Examiner*—Nimeshkumar D. Patel
*Assistant Examiner*—Kevin Quarterman
(74) *Attorney, Agent, or Firm*—Laurence A. Greenberg; Werner H. Stemer; Ralph E. Locher

(57) ABSTRACT

A planar electronic component has a functional layer with an optoelectronic or a circuit configuration between a substrate layer and a covering layer. A sealing frame or sealing ring is disposed between the substrate layer and the covering layer and connected to them by an integral joint surrounding the functional layer. The seal very largely protects the functional layer against hazardous external influences, in particular against moisture and oxygen. A mechanical connector, whose adhesive characteristics are matched to the materials of the covering layer and of the substrate, is provided in addition to the sealing ring. The connector fixes the substrate and covering layers mechanically with respect to one another, and may reduce the risk of partial or complete detachment in the event of deformation of the electronic component, in particular as a result of thermal expansion and/or mechanical loading.

16 Claims, 4 Drawing Sheets

COMPONENT WITH MECHANICAL CONNECTOR, IN PARTICULAR A DISPLAY APPARATUS WITH ORGANIC LIGHT-EMITTING DIODES

BACKGROUND OF THE INVENTION

Field of the Invention

The invention relates to a component, in particular to a display apparatus with organic light emitting diodes (OLEDs). More specifically, the invention pertains to a planar electronic component having a functional layer which has an optoelectronic configuration or a circuit configuration and is disposed between a substrate layer and a covering layer, with a sealing frame or sealing ring which is likewise disposed between the substrate layer and the covering layer and connected to them by an integral joint surrounding the functional layer and very largely protecting the functional layer (3) against hazardous external influences, such as moisture and oxygen.

For the present purposes, the functional layer may be a single layer or a layer assembly which is able to carry out specific electronic and/or optoelectronic functions.

The following description of the prior art and of the invention is based, by way of example, on a component in the form of an OLED display. However, it should be understood that these specific references do not limit the invention to only such display apparatuses.

OLEDs (organic light-emitting diodes) have a number of advantages over conventional LCDs (liquid crystal displays): they have a low power consumption, require little area, have fast switching times over a broad temperature range from −40° C. to 80° C. and a wide viewing angle. It should not be forgotten that OLEDs are self-emitting and therefore do not require any separate back-lighting.

OLEDs have an organic light emitting layer between two electrodes. If a sufficient electrical potential is applied to the electrodes, the organic light emitting layer emits radiation as a result of the recombination of holes and electrons that are injected into the organic layer. The organic layer and the two electrodes are typically designed using thin-film technology and are applied to a substrate which, by way of example, is composed of glass. The side of the assembly of electrodes and the organic light emitting layer facing away from the substrate is covered by a further glass or metal plate, which is normally attached by way of an adhesive. The double-sided configuration of a substrate and of the further glass or metal plate as well as sealing means which surround the assembly formed by the electrodes and the organic light emitting layer (referred to in the following text as an OLED assembly) and which are, for example, in the form of an adhesive ring results in the OLED assembly being largely hermetically encapsulated. This is necessary because the organic material and the electrodes are generally fairly sensitive to moisture and oxygen. Hermetic encapsulation such as this is therefore necessary for reliable operation.

In the configuration described above, the substrate and the glass or metal plate which is used as a covering layer are inflexible. However, for many applications, it is necessary for the component to have a certain amount of flexibility. Such flexibility with regard to bending loads may be necessary because the component is intended to be arranged on a base which is not flat, and is, more accurately, curved. Furthermore, such flexibility may be advantageous for the handling of the component, for example for a flexible or roll-up display.

In order to make it possible to produce a flexible component, a plastic substrate and a covering layer composed of plastic, for example, are used instead of the glass substrate and the glass or metal plate. However, the fact that the materials which are used are now flexible results in the requirements for the connecting technology between the substrate and the covering layer becoming more stringent, in order to provide sufficient protection for the OLED assembly against moisture and oxygen. While adhesively bonded, i.e., glued, rigid configurations need to absorb only shear forces acting on the adhesively bonded joint, the substrate layer and covering layer also have to be able to withstand tensile forces in flexible configurations, with tensile forces such as these occurring in particular in the edge area of the encapsulation where they place additional mechanical loads on the sealing means. The assembly comprising the substrate, the OLED assembly and the covering layer also has to withstand the loads which occur during bending of the structure sufficiently in order to very largely avoid delamination of the substrate, OLED assembly and covering layer.

This problem is evident from the illustration shown in FIGS. 1A and 1B.

FIG. 1A shows a plan view of an OLED display. FIG. 1B shows a cross section through the display along the section line I—I shown in FIG. 1A.

An OLED assembly 3 is applied on a rectangular substrate 2 which is composed of a flexible plastic. By way of example, the OLED assembly 3 has an array of OLED pixels. Since the basic design of OLEDs with an organic layer and electrodes is known from the prior art, it will not be described in detail at this point or in the figures.

As can be seen from FIG. 1A, contact can be made with the OLED assembly 3 from the outside by way of connecting lines 6. The connecting lines 6 are applied on a surface of the substrate 2 and they extend from the OLED assembly 3 to the edges of the substrate 2. By way of example, the connecting lines 6 are arranged along two side edges of the OLED assembly 3 and, in a corresponding manner, along two side edges of the substrate 2. However, the route of the connecting lines is of no importance to the problem described in the following text.

As can be seen better from FIG. 1B, a covering layer 4 is disposed on the OLED assembly 3. The covering layer has a larger area than the OLED assembly 3, so that a rim of approximately the same size projects along all of the side edges of the OLED assembly 3. A sealing ring 5 is formed in this overlapping area and surrounds the OLED assembly 3, a short distance away from it. The sealing ring 5 has no interruptions whatsoever and serves to protect the OLED assembly 3 against external influences, moisture and oxygen. For this purpose, a close connection is provided between the sealing ring 5 and the covering layer 4 as well as the substrate 2.

The sealing ring 5 is composed, for example, of adhesive, which at the same time secures the mechanical connection between the substrate 2 and the covering layer 4. On the other hand, the adhesive is chosen with respect to its material characteristics such that oxygen and moisture cannot get into the area or space enclosed by it.

Since both the substrate 2 and covering layer 4 are composed of flexible plastic, the component can withstand bending loads. However, the reliability of the component is ensured only provided that there are no leaks between the sealing ring 5 and the substrate 2 or the covering layer 4.

SUMMARY OF THE INVENTION

It is accordingly an object of the invention to provide a component, in particular a display device with organic LEDs which overcomes the disadvantages of the heretofore-known devices and methods of this general type and which ensures its functionality even when bending loads occur frequently. One particular object is to prevent the ingress of moisture and oxygen into the interior of the sealing ring.

With the foregoing and other objects in view there is provided, in accordance with the invention, a planar electronic component, comprising:

a substrate layer, a covering layer, and a functional layer with an optoelectronic configuration or a circuit configuration between the substrate layer and the covering layer;

a sealing frame or sealing ring between the substrate layer and the covering layer, connected to the substrate layer and the covering layer by an integral joint, and surrounding the functional layer and protecting the functional layer against hazardous external influences (e.g., moisture, oxygen);

a mechanical connector with adhesive characteristics matched to the materials of the covering layer and of the substrate, the mechanical connector being disposed between the substrate layer and the covering layer and for fixing the substrate layer and the covering layer in a mechanically robust manner with respect to one another.

The invention is based on the discovery that particular weak points of the component in FIGS. 1A and 1B are present at the four corner areas of the substrate/covering layer assembly 4. The covering layer 4 becomes detached from the sealing frame or sealing ring 5, with the hermetic encapsulation breaking down, even when subjected to comparatively small bending loads.

The invention therefore provides a connecting means for mechanical connection of the covering layer and of the substrate layer, whose adhesive characteristics are optimized both with respect to the covering layer and with respect to the substrate layer. The primary or even sole task of the connecting means is thus to ensure the mechanical connection and fixing of the substrate layer with respect to the covering layer. Provided that these connecting means very largely prevent or minimize relative movement between the substrate layer and the covering layer, the forces acting on the sealing frame or sealing ring are reduced or even absorbed completely. The risk of relative movement, which can result in particular in the covering layer or the substrate layer becoming delaminated from the sealing ring, can be effectively reduced by the connecting means. This considerably improves the reliability of the component.

The technical teaching according to the invention furthermore allows a material to be chosen for the sealing frame or sealing ring which is optimized primarily with respect to the capability for moisture and oxygen to pass through. In contrast, the adhesive force f the sealing ring with respect to the substrate layer or covering layer is of secondary importance for a component according to the invention.

According to one advantageous development of the component, it is sufficient for the connecting means to be arranged at points, in particular—when seen from the functional layer—outside the sealing frame or sealing ring which surrounds the functional layer, in an area wherein the substrate layer and covering layer overlap. It is therefore not absolutely necessary to provide a ring surrounding the functional layer, whose adhesive characteristics are matched to the materials of the covering layer and of the substrate layer.

The connecting means are preferably arranged in the corner areas of the assembly comprising the covering layer, the functional layer and the substrate layer. The mechanical connection of the corner areas considerably improves the robustness of the entire component.

The feature referred to as the "corner area" or "corner" should in this case be interpreted as follows: if the substrate layer and the covering layer are of the same size, that is to say these two components are arranged such that they essentially cover one another in a congruent manner, then the expression corner area means the corners of both the substrate layer and the covering layer. If, however, as is illustrated in FIGS. 1A and 1B, the covering layer is smaller than the substrate layer then the connecting means are arranged in the corner area of the covering layer. If the substrate layer is smaller than the covering layer, this should in contrast be understood to be the corners of the substrate layer.

The connecting means are preferably formed by an adhesive joint, an ultrasound welded connection, a spot weld, a soldered joint, a screw connection, a rivet and/or a bracket, or by a combination of two or more of these means.

Alternatively or in addition to the described point connecting means, these connecting means may, according to one advantageous development, comprise a first reinforcing frame or ring which is arranged between the substrate layer and the covering layer, is closely connected to them, and encases the functional layer. The first reinforcing frame or ring advantageously counteracts separation of the sealing frame or ring from the covering layer or substrate layer.

It is therefore particularly advantageous for the first connecting frame or ring to be arranged within the sealing frame or ring.

It has also been found to be advantageous for the connecting means to comprise a second reinforcing frame or ring which is arranged between the substrate layer and the covering layer, is closely connected to them, and likewise surrounds and encases the functional layer. The second reinforcing frame or ring is preferably arranged outside the sealing frame or ring as seen from the functional layer.

Both the first and the second reinforcing frame or ring ensure a mechanically robust and firm connection between the substrate layer and the covering layer. The sealing frame or ring which is arranged between the first and the second reinforcing frame or ring may in contrast be optimized with regard to the capability for moisture and oxygen to pass through. In contrast, the first and/or second reinforcing frame or ring comprise a material the adhesive characteristics of which are optimized with respect to the substrate layer and with respect to the covering layer.

According to one development, the first and/or second reinforcing frame or ring may have interruptions. In particular, it may be advantageous for the second reinforcing frame or ring to fill the areas between two point connecting means. This allows the area of the covering layer to be kept small. It is likewise feasible for the first reinforcing frame or ring to have interruptions.

Other features which are considered as characteristic for the invention are set forth in the appended claims.

Although the invention is illustrated and described herein as embodied in a component, in particular a display apparatus with organic light emitting diodes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
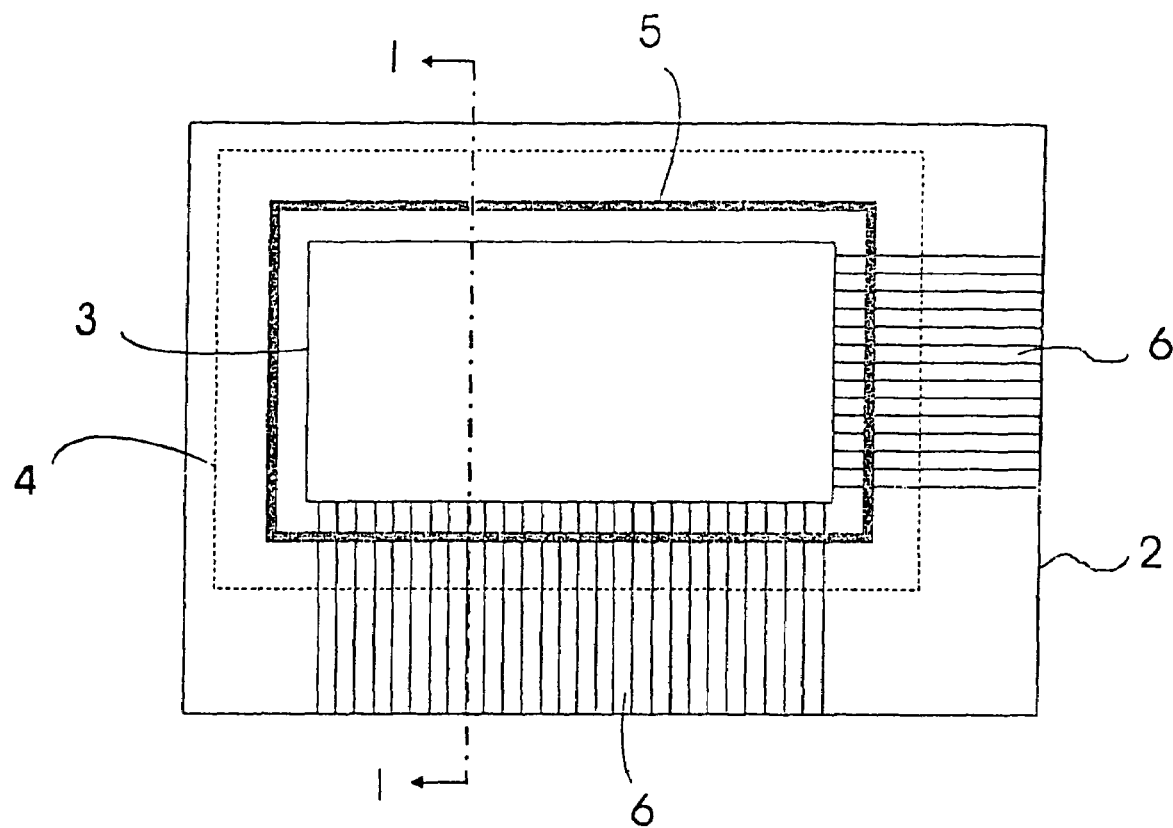
FIG. 1A is a plan view of a prior art OLED display device.
Figure 1B:
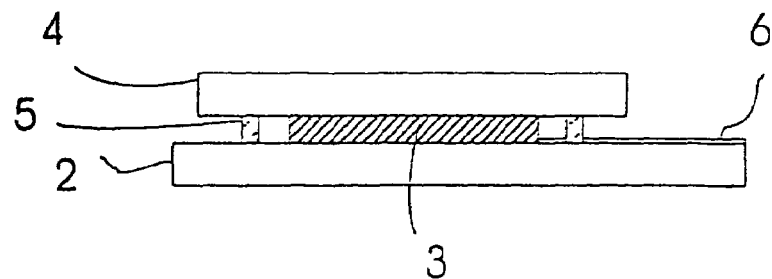
FIG. 1B is a section taken through the prior art device along the line I—I in FIG. 1A.

Referring now once more to the figures of the drawing in detail, it will be noted that several of the underlying structural details described above with reference to FIGS. 1A and 1B, also apply to the novel devices illustrated in the remaining figures. The exemplary embodiments of the invention refer back to the general design illustrated in FIGS. 1A and 1B and they have, furthermore, connecting means according to the invention that result in a considerable improvement in reliability.

A functional layer in the form of an OLED assembly 3 (see FIG. 2B, which shows a section along the line II—II from FIG. 2A) is arranged between a substrate layer 2 and a covering layer 4, both of which are composed of a flexible material, such as a plastic. The OLED assembly 3 represents, for example, an LED array composed of OLEDs. The component is thus in the form of a display device. Instead of the OLED assembly 3, it would also be possible to provide a solar cell or any other integrated circuit, preferably based on organic materials.

Figure 2A:
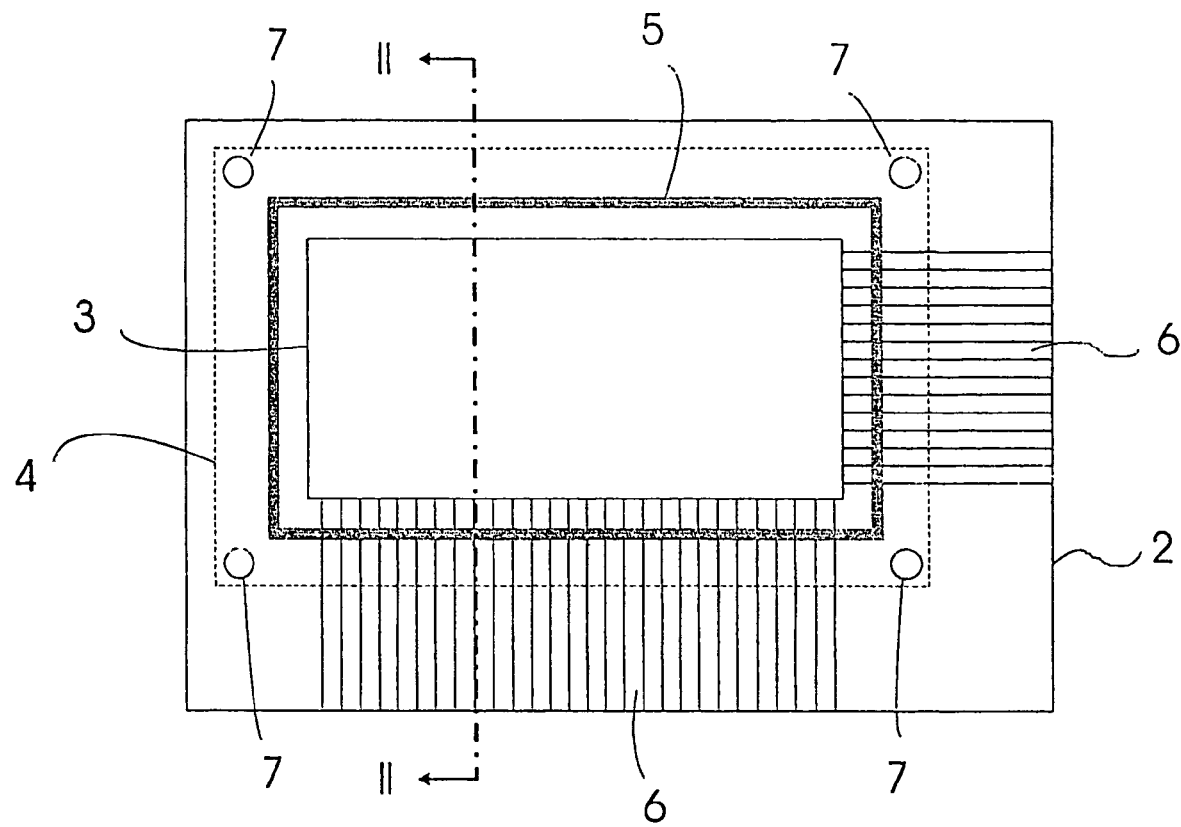
FIG. 2A is a schematic plan view illustration of a first exemplary embodiment of a component according to the invention.
Figure 2B:
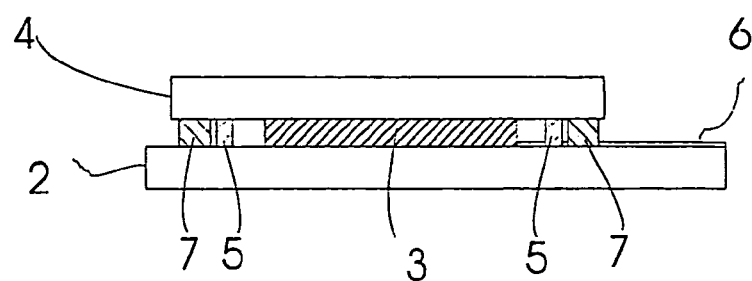
FIG. 2B is a section taken through the device along the line II—II in FIG. 2A.

As can be seen better from FIG. 2A, the OLED assembly 3 is surrounded by a sealing ring 5. The sealing ring 5 is closely connected to the covering layer 4 and to the substrate layer 2, as can be seen in FIG. 2B, in order to hermetically protect the enclosed OLED assembly 3 against external influences.

In order to prevent the covering layer or the substrate layer 2 from being detached from the sealing ring when bending occurs, point connectors 7 are also provided in the corner areas of the covering layer 4. The point connectors or point connecting means 7 are, for example, adhesive droplets, whose adhesive characteristics are matched to the materials of the substrate 2 and of the covering layer 4.

The material characteristics of the sealing ring 5, which admittedly also represents a certain amount of mechanical connection between the substrate layer 2 and the covering layer 4, can be optimized with regard to the ability for oxygen and moisture to pass into the inner space housing the functional layer 3, due to connecting means 7 that are provided.

Due to the reinforcement of the corner areas by way of the connectors 7, the robustness of the component is improved to a considerable degree. A test configuration wherein the outer corners of the covering layer 4 are reinforced by means of adhesive droplets withstood 100,000 bending cycles without being damaged, with a bending radius of 20 mm being used. A component as shown in FIG. 1 that was subjected to the same loads was damaged even after a considerably smaller number of bending cycles. Even better robustness is achieved by using a connection by way of ultrasonic welding instead of point adhesive spots.

The advantage of the component according to the invention is in particular that no modification whatsoever is required to known components. The material characteristics of the sealing rings, which are known by the expression "low permeation glue," are optimized with regard to moisture and oxidation, and can still be used. These sealing rings effectively prevent the ingress of moisture and oxygen, while the connecting means according to the invention ensure the robustness and reliability of the component.

The point connections 7 shown in FIG. 2 may also be produced by soldering, brackets, screws, rivets, or welding.

Figure 3A:
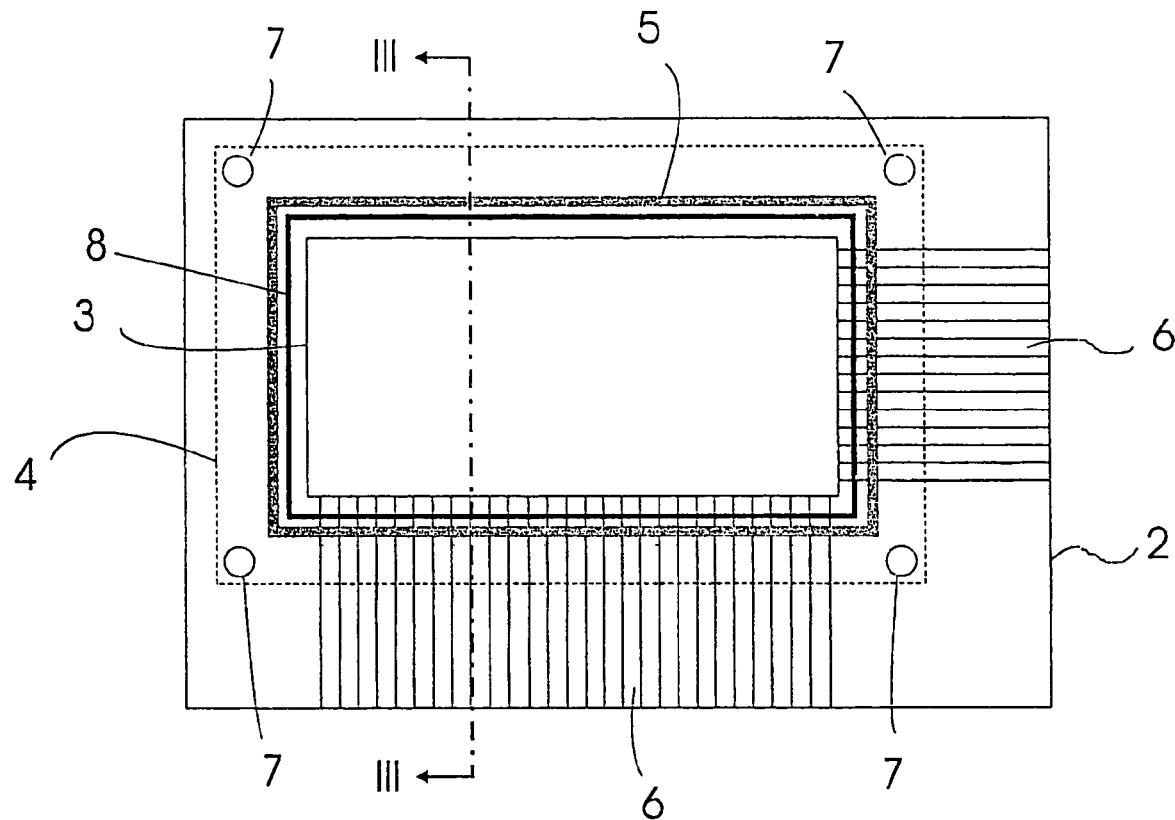
FIG. 3A is a schematic plan view illustration of a second exemplary embodiment of a component according to the invention.
Figure 3B:
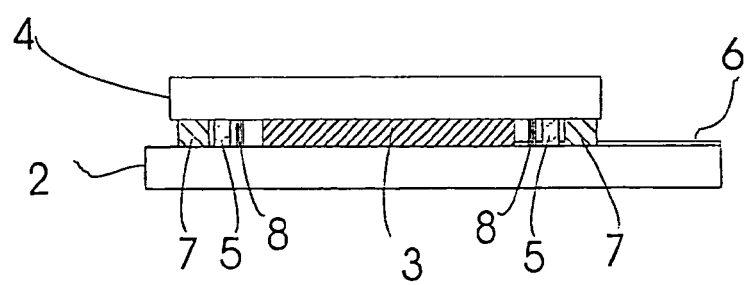
FIG. 3B is a section taken through the device along the line III—III in FIG. 3A.

FIGS. 3A, 3B show a further development of the component according to the invention. Once again, FIG. 3A shows a plan view of the component according to the invention, while FIG. 3B shows a cross section along the dashed-dotted line III—III from FIG. 3A.

Experiments have shown that the inner rim of the sealing ring 5 may be a further weakness. This weakness is particularly evident when the point connections 7 are used.

In order to prevent the sealing ring from being detached (delaminated) from the covering film 4 or from the substrate layer 2, a first reinforcing ring 8 is therefore provided. When seen from the OLED assembly 3, the reinforcing ring 8 runs within the sealing ring 5, and will therefore be referred to in the following text as the inner reinforcing ring. Like the sealing ring 5, it also surrounds the OLED assembly 3.

As is shown in FIG. 3A, the inner reinforcing ring 8 may be formed without any interruption. However, it is also feasible for interruptions to be provided.

The adhesive characteristics of the inner reinforcing ring 8 are optimized with respect to the covering layer 4 and the substrate layer 2. No particular requirements have to be met with respect to the capability of moisture or oxygen to pass through. This protective task is carried out by the sealing ring 5.

Figure 4A:
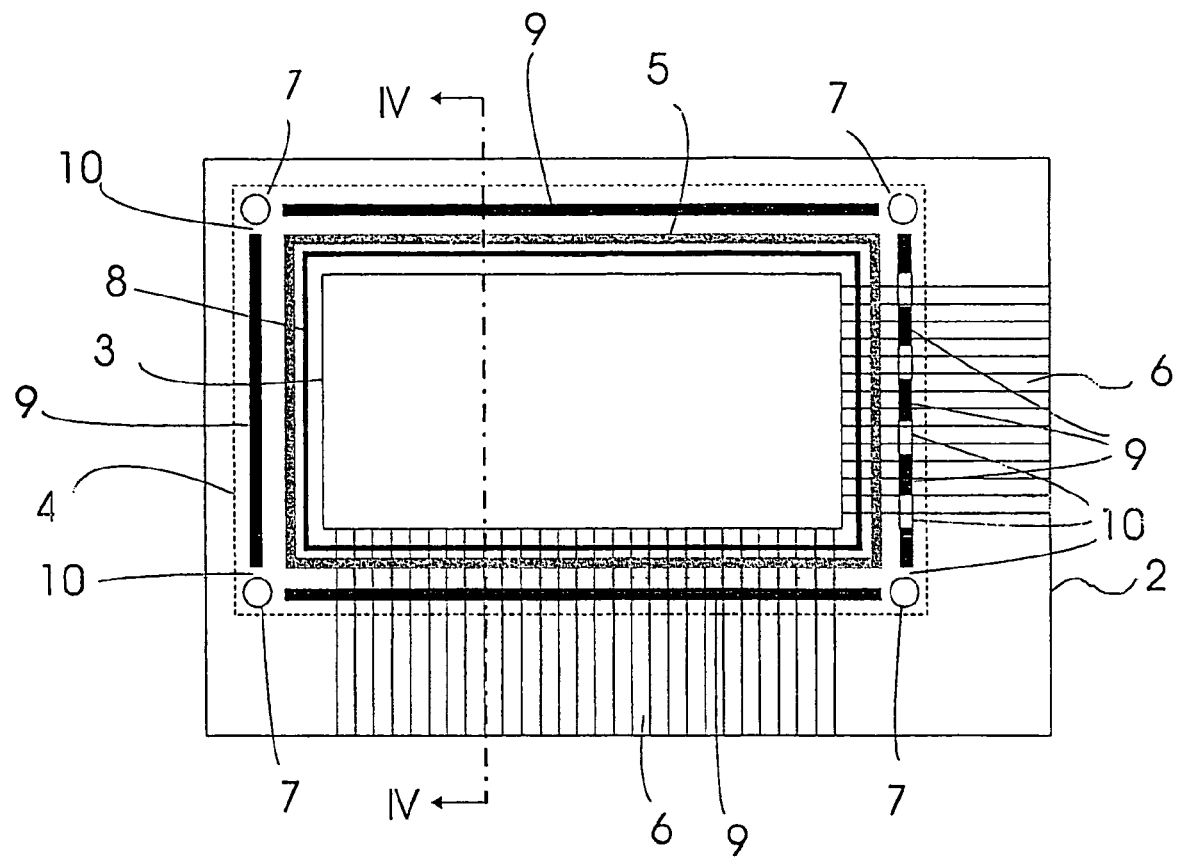
FIG. 4A is a schematic plan view illustration of a third exemplary embodiment of a component according to the invention.
Figure 4B:
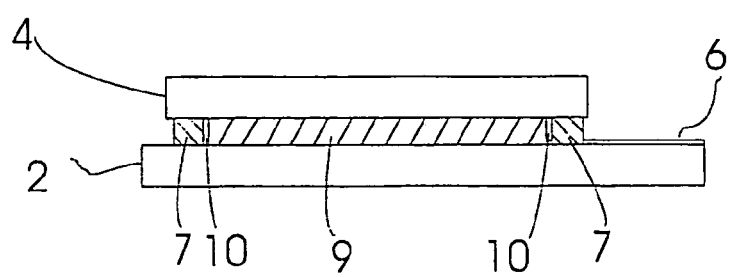
FIG. 4B is a section taken through the device along the line IV—IV in FIG. 4A.

The third exemplary embodiment shown in FIGS. 4A, 4B has a second reinforcing ring 9 added to it. The second reinforcing ring 9 is also referred to as the outer reinforcing ring since it is arranged outside the sealing ring 5, when seen from the OLED assembly 3.

In order to make it possible to design the area of the covering layer 4 to be as small as possible, the outer reinforcing ring 9 is subdivided into sections, which each extend between two point connections 7. Interruptions 10 are thus provided between a point connection 7 and a section of the outer reinforcing ring 9. As can be seen from the section of the outer reinforcing ring 9 shown on the right in FIG. 4A, the section may also itself have interruptions 10. In contrast to the illustration the interruptions may in this case be provided in each of the four sections.

The exemplary embodiments which are illustrated in FIGS. 2 to 4 may, for example, represent a matrix display. A matrix display which operates on the basis of light emitting polymers is arranged on a flexible plastic substrate in a known manner. A covering layer which is composed of plastic is then adhesively bonded to the arrangement, with an adhesive through which little moisture and oxygen can pass surrounding the light emitting polymers. Point connections are then produced in the corner areas of the covering layer by means of ultrasound welding. This results in a mechanically robust component which is protected against environmental influences and at the same time has a good bending capability.

Furthermore, the component according to the invention could be represented by a flexible light source which is produced as described above.

It is also within the scope of the invention for the functional layer to be in the form of a solar cell composed of conjugated polymers. Furthermore, a large number of further applications are feasible, in particular for organic detectors as well as integrated circuits based on polymers.

The foregoing description of the invention with reference to its implementation as an OLED display component should not be understood that the invention relates exclusively to display apparatuses such as these. In fact, the invention can also be used, inter alia, for integrated circuits, solar cells, sensors and detectors, based in particular on polymers, and the like.

This application claims the priority, under 35 U.S.C. § 119, of German patent application No. 103 14 522.2, filed Mar. 31, 2003, and of German patent application No. 103 29 366.3, filed Jun. 30, 2003; the disclosures of the prior applications are herewith incorporated by reference in their entirety.

We claim:

1. A planar electronic component, comprising:
   a substrate layer and a covering layer;
   a functional organic light-emitting layer with an optoelectronic configuration or a circuit configuration between said substrate layer and said covering layer;
   a sealing frame or sealing ring between said substrate layer and said covering layer, connected to said substrate layer and said covering layer by an integral joint, and surrounding said functional organic light-emitting layer and protecting said functional organic light-emitting layer against hazardous external influences;
   a mechanical connector with adhesive characteristics matched to materials of said covering layer and of said substrate, said mechanical connector being disposed between said substrate layer and said covering layer and for fixing said substrate layer and said covering layer in a mechanically robust manner with respect to one another, said mechanical connector having connectors selected from the group consisting of reinforcing strips and points disposed between said substrate layer and said covering layer.

2. The component according to claim 1, wherein said mechanical connector is configured and disposed to reduce a risk of detachment of said substrate layer and said covering layer from one another in an event of a deformation of the electronic component.

3. The component according to claim 1, wherein said mechanical connector between said substrate layer and said covering layer is particularly configured to reduce a risk of partial or complete detachment due to one of thermal expansion and mechanical loading of the component.

4. The component according to claim 1, wherein said sealing frame or sealing ring between said substrate layer and said covering layer is particularly configured to seal and protect said functional organic light-emitting layer against an ingress of fluid.

5. The component according to claim 4, wherein said sealing frame or sealing ring protects said functional organic light-emitting layer against oxygen and moisture.

6. The component according to claim 1, wherein said mechanical connector is disposed outside said sealing frame or sealing ring, as seen from said functional organic light-emitting layer.

7. The component according to claim 1, wherein said mechanical connector is one of a plurality of connectors disposed outside a space enclosed by said sealing frame or sealing ring and housing said functional organic light-emitting layer.

8. The component according to claim 1, wherein said mechanical connector is disposed in an overlapping area of said substrate layer and said covering layer.

9. The component according to claim 1, wherein said substrate layer and said covering layer are each formed as a quadrilateral in a plan view thereof, and said mechanical connector is one of a plurality of substantially punctiform connecting elements disposed at corners of an assembly defined by said substrate layer and said covering layer and in between said covering layer and said substrate layer.

10. The component according to claim 1, wherein said assembly has a rectangular outline defined by said substrate layer and said covering layer.

11. The component according to claim 1, wherein said mechanical connector is at least one connection selected from the group consisting of an ultrasound welded connection, a spot weld, a soldered joint, a screw connection, a rivet, and a bracket.

12. The component according to claim 1, wherein said mechanical connector is a reinforcing frame or ring disposed between said substrate layer and said covering layer and between said functional organic light-emitting layer and said sealing frame or sealing ring.

13. The component according to claim 1, wherein said reinforcing strips are formed with interruptions.

14. The component according to claim 12, wherein said reinforcing frame or ring is formed with interruptions.

15. An OLED display device, comprising:
   a substrate layer and a covering layer;
   an organic light-emitting layer between said substrate layer and said covering layer;
   a sealing frame or sealing ring between said substrate layer and said covering layer, connected to said substrate layer and said covering layer by an integral joint, and defining a space encasing and protecting said organic light-emitting layer against hazardous external influences; and
   a mechanical connector with adhesive characteristics matched to materials of said covering layer and of said substrate disposed between said substrate layer and said covering layer, for mechanically fixing said substrate layer and said covering layer to one another, said mechanical connector having connectors selected from the group consisting of reinforcing strips and points disposed between said substrate layer and said covering layer.

16. The display device according to claim 15, wherein said mechanical connector is configured to reduce a risk of detachment of said substrate layer and said covering layer from one another in an event of a deformation of the OLED display device.

* * * * *

UNITED STATES PATENT AND TRADEMARK OFFICE
CERTIFICATE OF CORRECTION

PATENT NO.        : 7,141,925 B2                                          Page 1 of 1
APPLICATION NO.   : 10/815577
DATED             : November 28, 2006
INVENTOR(S)       : Georg Wittmann et al.

It is certified that error appears in the above-identified patent and that said Letters Patent is hereby corrected as shown below:

Title Page
Item (73),

Assignee location, "Rengensburg" should read -- Regensburg --

Signed and Sealed this

Sixth Day of February, 2007

JON W. DUDAS
*Director of the United States Patent and Trademark Office*